United States Patent [19]

Mitchell

[11] 4,204,178

[45] May 20, 1980

[54] ACOUSTIC WAVE DEVICES

[75] Inventor: Richard F. Mitchell, Merstham, England

[73] Assignee: U.S. Philips Corporation, New York, N.Y.

[21] Appl. No.: 892,116

[22] Filed: Mar. 31, 1978

[30] Foreign Application Priority Data

Apr. 7, 1977 [GB] United Kingdom ............... 14806/77
Feb. 20, 1978 [GB] United Kingdom ............... 14806/78

[51] Int. Cl.$^2$ ........................ H03H 9/02; H03H 9/26; H03H 9/32
[52] U.S. Cl. ................................... 333/194; 310/313; 333/147; 333/196
[58] Field of Search ......... 333/30 R, 72, 71, 150–155, 333/193–196; 331/107 A; 310/313, 365, 366; 330/5.5

[56] References Cited

U.S. PATENT DOCUMENTS

| | | | |
|---|---|---|---|
| 3,760,204 | 9/1973 | Yester, Jr. .......................... | 333/72 X |
| 3,886,504 | 5/1975 | Hartmann et al. ..................... | 333/72 |
| 3,950,713 | 4/1976 | Lewis ................................ | 333/72 X |
| 4,056,793 | 11/1977 | Wagers et al. ......................... | 333/72 |

OTHER PUBLICATIONS

Browning et al., "New Family of Bulk Acoustic Wave Devices Employing Interdigital Transducers," in Electronics Letters, Mar. 3, 1977, vol. 13, No. 5, pp. 128–130.

Suzuki et al., "Some Studies on Saw Resonators and Multiple-Mode Filters," in 1976 Ultrasonic Symposium Proceedings, IEEE Cat. #76, CH1120-5SU, pp. 297–302.

*Primary Examiner*—Paul L. Gensler
*Assistant Examiner*—Marvin Nussbaum
*Attorney, Agent, or Firm*—Thomas A. Briody; William J. Streeter; Bernard Franzblau

[57] ABSTRACT

An acoustic surface wave device employs a substrate structurally orientated to enhance the propagation of acoustic surface skimming bulk waves. Multiple reflections from opposed end faces of the substrate establish an acoustic surface skimming bulk standing wave at a predetermined frequency. An interdigital transducer couples to the standing wave. A plurality of devices may be intercoupled to provide a bandpass filter.

8 Claims, 8 Drawing Figures

ACOUSTIC WAVE DEVICES

This invention relates to acoustic wave devices.

A study of the generation of bulk acoustic waves by interdigital transducers has been published by R. F. Mitchell in the Proceedings of the IEEE 1974 Ultrasonics Symposium p.313. In this publication it is shown that up to 3 distinct bulk acoustic waves may propagate in any given direction in an infinite solid material. One, the longitudinal or compressional wave, has a particle motion which is substantially parallel to the propagation direction. The other two, the shear waves, have particle motions which are perpendicular to each other and to that of the longitudinal wave. In certain propagation directions in certain materials the two shear waves have the same velocity and so are mutually indistinguishable. The direction of particle motion is then determined only by the mechanism generating the waves. In general, however, the shear waves have different velocities and their particle motions relative to the crystal structure are distinct and determined only by the propagation direction and the material used. Methods are described in the paper by R.F. Mitchell for choosing the orientation of the surface relative to the crystal structure of the substrate and of the transducer upon the surface so as to enhance or suppress the generation of one or more of these bulk waves. It is further shown that only a longitudinal wave or a shear wave whose natural particle motion is substantially parallel to the surface (a 'horizontally polarised shear wave') are capable of propagating for substantial distances close to and parallel to the free surface of a solid substrate.

In the opening summary of a letter by T.I. Browning and M.F. Lewis in Electronics Letters, 3rd March 1977, Vol. 13, No. 5 pages 128 to 130, it is stated that: "An important new family of acoustic wave devices is described which has the simplicity, versatility and planar construction of s.a.w. devices, together with the attractive properties of bulk wave devices, including high velocity, low attenuation, good temperature stability and insensitivity to surface contamination". In this letter, the above-mentioned paper by R.F. Mitchell is acknowledged in relation to bulk acoustic waves which are capable of propagating close to and parallel to the free surface of a solid substrate. The letter describes a particularly suitable family of cuts of quartz for devices using these waves and states that these devices are very attractive for certain applications, especially bandpass filters and stable high-frequency oscillators. It also emphasises that in these devices these waves are beamed along the surface and are received by the output transducer long before they reach the lower surface of the sample, and furthermore uses the term "surface-skimming" bulk waves to distinguish these waves.

In what follows in this specification, an acoustic surface skimming bulk wave means an acoustic bulk wave which propagates substantially parallel and close to a surface of a substrate. It should be noted that the character of the bulk wave disturbances will be slightly modified by the presence of the free surface. In what follows the term bulk wave is used to include waves suffering such slight modifications while not losing their characteristic properties, viz. particle motion substantially in the direction of propagation (longitudinal wave) or substantially perpendicular to it (shear waves).

Thus, from the above-mentioned letter in Electronics Letters there are known acoustic wave devices of a type including a substrate structurally orientated to enhance the propagation of acoustic surface skimming bulk waves in the substrate adjacent a predetermined surface of the substrate and a transducer disposed on said surface to couple to said waves.

An object of the present invention is to provide acoustic wave devices of the type defined in the preceding paragraph but which employ acoustic surface skimming bulk standing waves, instead of the devices having a delay line formed by two transducers which are specifically described in the above-mentioned letter in Electronics Letters and which employ acoustic surface skimming bulk travelling waves.

According to the invention there is provided an acoustic wave device of the type defined in the penultimate paragraph, characterised in that a pair of opposing end faces of the substrate is provided to multiply reflect said waves propagating adjacent said surface and to form a resonant cavity capable of supporting an acoustic surface skimming bulk standing wave at a predetermined frequency, and in that said transducer is arranged in said cavity for coupling with acoustic surface skimming bulk standing wave energy at said frequency.

The invention is based on the realisation that reflection of acoustic surface skimming bulk waves from substrate end faces is intrinsically more efficient than the reflection of Rayleigh acoustic surface waves from periodic reflecting gratings which are used in conventional Rayleigh wave resonator devices, such as are described for example in U.S. Pat. No. 3,886,504, and so high "Q" values should be more readily obtainable. Also, the cavity size can in suitable cases be changed by merely grinding the end faces of the substrate. This provides easy tuning of the resonant frequency over a wide range of frequencies, after manufacture. Such tuning is not possible in Rayleigh wave resonators, and can be done only to a limited extent with conventional bulk wave resonators.

According to one preferred embodiment of the invention said transducer is arranged to suppress coupling to Rayleigh waves at said frequency. According to another preferred embodiment of the invention velocity reducing means are provided at said surface in said cavity in addition to said transducer to reduce the velocity of said acoustic surface skimming bulk waves thereby enhancing the propagation of said waves, with said velocity reducing means and said transducer extending over substantially the whole distance between said pair of end faces. According to another preferred embodiment of the invention said transducer extends over substantially the whole distance between said pair of end faces.

The features described in the preceding paragraph contribute to the efficiency of coupling to and to the conservation of energy of acoustic surface skimming bulk waves, which properties are particularly desirable in order to achieve the high "Q" values required for resonator devices.

Two acoustic wave devices according to the invention may be included in an electrical bandpass filter, in which said transducer in one of the devices forms the input transducing means arranged to launch acoustic surface skimming bulk wave energy into the cavity of that device which forms acoustic surface skimming bulk standing wave energy therein, in which means are provided for coupling the cavities of the two devices whereby acoustic surface skimming bulk standing wave energy is formed in the cavity of the other device, and in which said transducer in the other device forms the output transducing means arranged to receive acoustic surface skimming bulk wave energy from the cavity of the other device.

The band-pass filter described in the preceding paragraph may be modified in that one said end face of each of the two devices is replaced by at least one periodic reflecting grating at the surface of a single substrate having both said devices in alignment, and in that said at least one periodic grating has a reflectivity for allowing the passage of acoustic surface skimming bulk wave energy therethrough so as to provide said means for coupling the cavities of the two devices.

Embodiments of the invention will now be described with reference to the accompanying drawings, in which.

Figure 1:
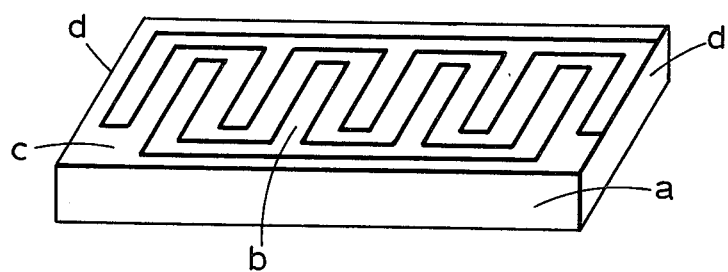
FIG. 1 shows a resonator with a single transducer covering the propagation surface.

Referring now to FIG. 1, there is provided a piezoelectric substrate a and transducing means b disposed upon a propagation surface c so as to launch a bulk acoustic wave substantially parallel to the surface, the wave being an acoustic surface skimming bulk wave that can reflect efficiently from end faces d provided on either side of the transducing means and so form a standing wave resonance between the end faces, at a chosen mode frequency. These faces d are preferably substantially parallel to the wave fronts of the wave and may also be perpendicular to the surface c. The transducing means is an interdigital transducer capable of exciting at least the required acoustic surface skimming bulk wave at the mode frequency. The transducer may be designed, for example by varying the length, spacing and number of electrodes, so as to restrict the range of frequencies over which the required acoustic surface skimming bulk wave or other acoustic disturbances are generated. For example the transducer design ma be arranged substantially to suppress generation of a Rayleigh wave at or around the frequency of a required acoustic surface skimming bulk wave resonance. It is necessary that the transducer b be so placed in relation to the reflecting end faces d so as to provide effective coupling to the required resonance pattern, that is to acoustic surface skimming bulk standing wave energy at the chosen mode frequency. This will usually require that the electrodes of the transducer should not all be located on nodes of the voltage standing wave pattern associated with the required resonance. The opposite surface of the substrate may be roughened or angled relative to the propagation surface to suppress unwanted modes.

The substrate used may be a sample of a single piezoelectric material, such as quartz, lithium niobate, bismuth silicon oxide or piezoelectric ceramic; or it may be a layered structure containing a number of layers of which one or more may be piezoelectric.

Figure 2:
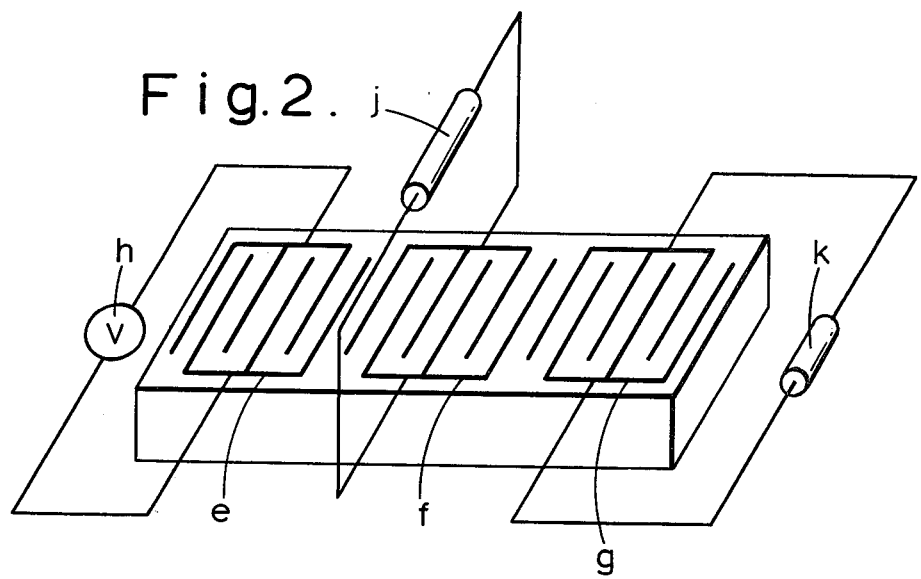
FIG. 2 shows a resonator with several transducers collectively covering the propagation surface.
Figure 3:
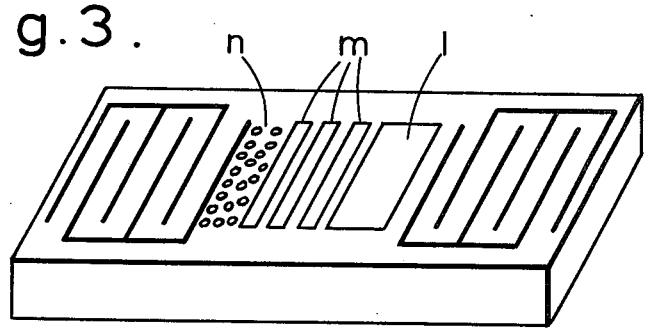
FIG. 3 shows a resonator having metallic or dielectric overlays to help confine the surface skimming bulk wave to the propagation surface region.

As shown in FIG. 1, the transducer b extends over substantially the whole distance between the end faces d and hence covers substantially the whole distance between the end faces d and hence covers substantially the whole area of the free surface beneath which the wave propagates. This is one example of a measure taken to reduce the velocity of the acoustic surface skimming bulk wave in the surface region where that wave propagates relative to the velocity which the same wave would have in the absence of such measures in order to confine the bulk wave as closely as possible to the surface region. Other measures may be taken for the same purpose, for example, the surface region may be treated, for example by diffusion or ion implantation so as to change the chemical composition and/or the mechanical properties in the surface region and so reduce the velocity. Another possibility is that several transducing means may be provided so as collectively to cover substantially all the said free surface and these several transducers may include one or more input transducers, possibly but not necessarily, connected together by means of additional electrical circuits or connections, and one or more output transducers possibly but not necessarily connected together by means of additional circuits or connections. As an example of this possibility, FIG. 2 shows three interdigital transducers e, f and g with the transducer e being connected to an input h and the transducers f and g being connected to respective load impedances j and k. Another possibiliy is to deposit metallic or dielectric layers on those parts of the said free surface not covered by transducers. As shown in FIG. 3, these layers may be a continuous area 1 or in the form of electrically isolated, but closely spaced strips m or dots n.

The acoustic surface skimming bulk wave which forms the resonance may be either a longitudinal wave propagating substantially parallel to the surface or a shear wave with particle motion substantially parallel to the surface ("horizontally polarised") and travelling substantially parallel to the surface. The method for selecting the orientation of the surface and propagation direction relative to the crystal structure of the substrate may utilise the information available, for single crystal substrates, in the paper by Mitchell already mentioned; similar principles apply for multilayers materials. The orientation may be chosen so that only a longitudinal wave, or only a horizontally polarised shear wave can be generated by the transducer. The orientation may also, or alternatively, be chosen so that the variation of delay with temperature for the chosen wave is substantially zero. In the case of a horizontally polarised shear wave the orientation may also, or alternatively, be chosen so that the propagation velocity of the shear wave is lower than that of any other travelling acoustic wave which can propagate in the chosen direction; or the orientation may be chosen so that the velocity of the surface skimming bulk wave is lower than that of any other acoustic wave which can be generated by the transduction means at the resonant frequency.

Figure 4:
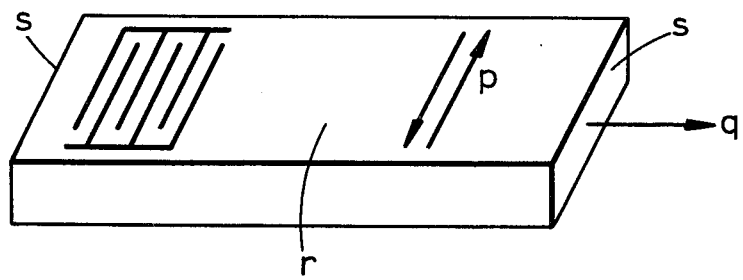
FIG. 4 shows a resonator illustrating a general means of selecting the substrate orientation.

When using a particular substrate material the correct orientation may be chosen by selecting a direction in which a bulk shear wave shows some desired property and constructing the resonator so that the surface contains both the direction of particle motion of the said shear wave and the chosen direction. The required property may be for example a substantially zero temperature coefficient of delay at a given temperature. In this case if the substrate is quartz the chosen propagation direction may be the direction perpendicular to the AT, BT or other known zero temperature coefficient cut. The transducer(s) will be disposed so as to launch the wave in substantially the said direction. Since interdigital transducers are used the electrodes will lie substantially parallel to the associated shear particle motion. FIG. 4 shows the wave reflecting end faces s cut substantially parallel to the direction p of particle motion of the shear wave, perpendicular to the free surface r and separated by substantially an integral number of half-wavelengths of the shear wave at the required resonant frequency. The direction q of shear wave propagation shown in FIG. 4 has a substantially zero temperature coefficient of delay for the shear wave. A specific example is where the end faces s shown in FIG. 4 are those faces which in an AT-cut bulk wave oscillator quartz crystal plate would be the major faces of the plate carrying the pair of electrodes to excite the bulk wave.

Figure 5:
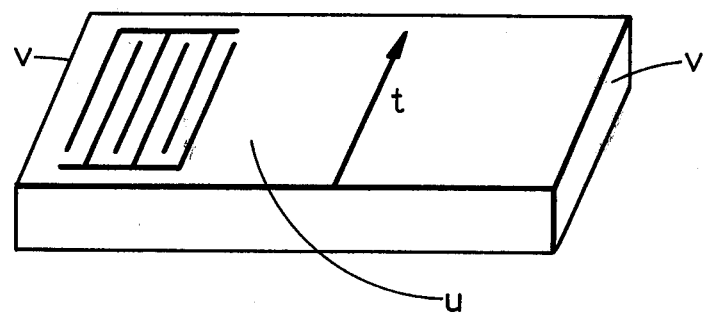
FIG. 5 shows a resonator illustrating a particular means of selecting the substrate orientation for a ceramic substance.

Referring now to FIG. 5, when a piezoelectric ceramic substrate is used, the orientation should be such that the free surface contains the polarisation direction. The electrodes of the interdigital transducer or transducers are preferably substantially parallel to the polarisation direction t so as to launch a shear wave in a direction perpendicular to the polarisation and parallel to the free surface u. The end faces v for reflecting the wave may be cut substantially parallel to the polarisation direction, are substantially perpendicular to the free surface and are separated by substantially an integral number of half-wavelangths of the shear wave at the required resonant frequency.

Figure 6:
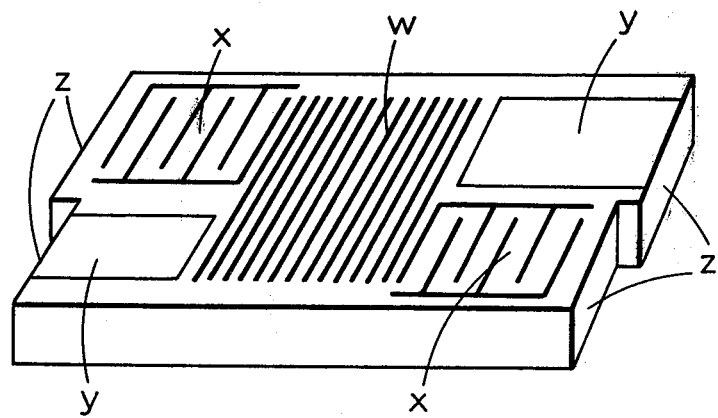
FIG. 6 shows two coupled resonators using a multistrip coupler.
Figure 7:
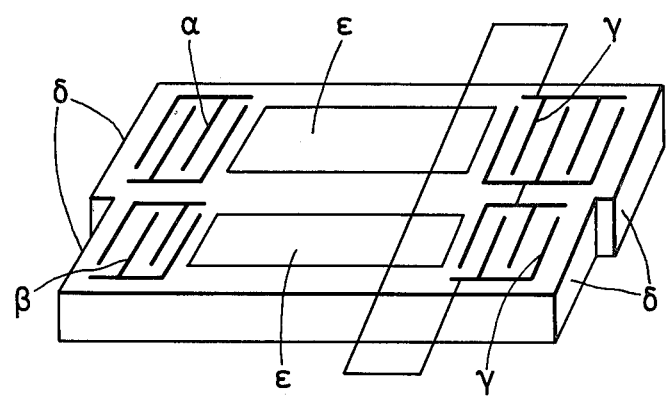
FIG. 7 shows two resonators coupled by transducers.
Figure 8:
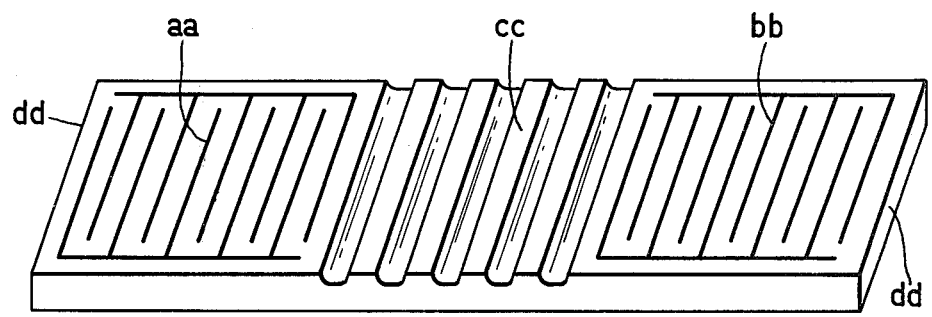
FIG. 8 shows two resonators coupled acoustically.

Two or more resonators such as those described above may be coupled together to form a bandpass filter. The coupling means may be one or more multistrip couplers or transducers so disposed that the existence of the required resonance in one resonator generates a resonance in the other resonator or resonators by means of the coupling means. FIG. 6 shows two resonators formed by reflecting end faces z, an interdigital transducer x in each cavity, a multistrip coupler w coupling the two cavities, and metal or dielectric overlay areas y. The coupler w and the overlay areas y form velocity reducing means in addition to the transducers x which enhance the propagation of acoustic surface skimming bulk waves in the resonators. FIG. 7 shows two resonators formed by reflecting end faces $\delta$, an input transducer $\alpha$ in one cavity and an output transducer $\beta$ in the other cavity, and electrically connected coupling transducers $\gamma$ and metal or dielectric overlay areas $\beta$. The coupling transducers $\gamma$ and the overlay areas $\epsilon$ form velocity reducing means in addition to the transducers $\alpha$ and $\beta$ which enhance the propagation of acoustic surface skimming bulk waves in the resonators. FIG. 8 shows two resonators placed in line one behind the other. Each resonator has one reflecting end face dd and the other reflecting end face of each resonator is replaced by a periodic reflecting grating cc. The elements of the grating cc are shown as grooves but may be metallic or dielectric overlays or other pertubations of the acoustic properties of the surface region so as to give a partial reflection, the unreflected acoustic surface skimming bulk wave energy providing the coupling. One resonator contains an input transducer aa and the other resonator contains an output transducer bb.

When two or more resonators are coupled together or used in the same electrical circuit or subsystem, the various resonators may contain different integer numbers of half-wavelengths at their respective resonant frequencies.

What is claimed is:

1. An acoustic wave device comprising a substrate structurally orientated to enhance the propagation of acoustic surface skimming bulk waves in the substrate adjacent a predetermined surface of the substrate, said substrate having a pair of opposing end faces arranged to multiply reflect said waves propagating adjacent said surface so as to form a resonant cavity capable of supporting an acoustic surface skimming bulk standing wave at a predetermined frequency, a transducer disposed on said surface and within said cavity for coupling with acoustic surface skimming bulk standing wave energy at said frequency, and velocity reducing means provided at said surface in said cavity in addition to said transducer to reduce the velocity of said acoustic surface skimming bulk waves thereby enhancing the propagation of said waves, said velocity reducing means and said transducer extending over substantially the whole distance between said pair of end faces.

2. An acoustic wave device as claimed in claim 1 wherein said transducer is arranged to suppress coupling to Rayleigh waves at said frequency.

3. An electrical band-pass filter device including first and second acoustic wave devices each as claimed in claim 1 wherein said transducer in a first one of the devices forms an input transducing means arranged to launch acoustic surface skimming bulk wave energy into the cavity of that device which forms acoustic surface skimming bulk standing wave energy therein, said device further comprising means for coupling the cavities of the first and second acoustic wave devices whereby acoustic surface skimming bulk standing wave energy is formed in the cavity of the second device, and in which the transducer in the second device forms an output transducing means arranged to receive acoustic surface skimming bulk wave energy from the cavity of the second device.

4. An acoustic wave device comprising a substrate structurally orientated to enhance the propagation of acoustic surface skimming bulk waves in the substrate adjacent a predetermined surface of the substrate, said substrate having a pair of opposing end faces arranged to multiply reflect said waves propagating adjacent said surface so as to form a resonant cavity capable of supporting an acoustic surface skimming bulk standing wave at a predetermined frequency, and a transducer disposed on said surface and within said cavity for coupling with acoustic surface skimming bulk standing wave energy at said frequency, and wherein said transducer extends over substantially the whole distance between said pair of end faces.

5. An acoustic wave device as claimed in claim 4 wherein said transducer is arranged to suppress coupling to Rayleigh waves at said frequency.

6. An acoustic wave band-pass filter device comprising a substrate structurally oriented to enhance the propagation of acoustic surface skimming bulk waves in the substrate adjacent a predetermined surface thereof, said substrate having at least one pair of opposed end faces arranged to multiply reflect said waves propagating adjacent said surface so as to form first and second resonant cavities capable of supporting acoustic surface skimming bulk standing waves at a predetermined frequency, an input transducer disposed on said surface within said first resonant cavity and arranged to launch acoustic surface skimming bulk wave energy into said first cavity to form a standing wave therein at the predetermined frequency, means for coupling said first and second resonant cavities so that an acoustic surface skimming bulk standing wave is formed in the second cavity, and an output transducer disposed on said surface within said second resonant cavity and arranged to receive energy from the acoustic surface skimming bulk standing wave in the second cavity.

7. An acoustic wave device as claimed in claim 6 wherein at least one of said transducers is arranged to suppress coupling to Rayleigh waves at said predetermined frequency.

8. A band-pass filter device as claimed in claim 3 or claim 6 wherein said first and second resonant cavities are arranged in alignment on a single substrate and further comprising at least one periodic reflecting grating at the surface of the single substrate arranged between and separating the first and second cavities, and wherein said at least one periodic grating has a reflectivity for allowing the passage of acoustic surface skimming bulk wave energy therethrough so as to provide said means for coupling the first and second resonant cavities.

* * * * *